United States Patent
Huang et al.

(10) Patent No.: US 8,309,165 B2
(45) Date of Patent: Nov. 13, 2012

(54) COLOR FILTER BY COPPER AND SILVER FILM AND METHOD FOR MAKING SAME

(75) Inventors: Sen-Huang Huang, Hsin-Chu (TW); Chin-Poh Pang, Hsin-Chu (TW); Hsin-Hui Hsu, Hsin-Chu (TW)

(73) Assignee: Pixart Imaging Inc., Hsin-Chu (TW)

(*) Notice: Subject to any disclaimer, the term of this patent is extended or adjusted under 35 U.S.C. 154(b) by 0 days.

(21) Appl. No.: 13/327,325

(22) Filed: Dec. 15, 2011

(65) Prior Publication Data
US 2012/0085656 A1    Apr. 12, 2012

Related U.S. Application Data

(62) Division of application No. 12/470,856, filed on May 22, 2009, now Pat. No. 8,221,888.

(51) Int. Cl.
*B05D 5/12* (2006.01)

(52) U.S. Cl. ........ 427/109; 427/123; 427/124; 427/125; 428/432; 428/433; 428/434; 428/698; 428/699; 250/226; 359/359; 359/360; 359/361

(58) Field of Classification Search ............... 427/109, 427/123, 124, 125; 428/432, 433, 434, 698, 428/699; 250/226; 359/359, 360, 361
See application file for complete search history.

(56) References Cited

U.S. PATENT DOCUMENTS
7,521,666 B2 * 4/2009 Tsang .................. 250/226
* cited by examiner

*Primary Examiner* — Cathy Lam
(74) *Attorney, Agent, or Firm* — Tung & Associates

(57) ABSTRACT

The present invention discloses a color filter by copper and silver film, comprising: a lower copper layer; a lower silver layer formed on the lower copper layer; a medium formed on the lower silver layer; an upper copper layer formed on the medium; and an upper silver layer formed on the upper copper layer.

4 Claims, 2 Drawing Sheets

US 8,309,165 B2

COLOR FILTER BY COPPER AND SILVER FILM AND METHOD FOR MAKING SAME

This is a Divisional of a application Ser. No. 12/470,856, filed on May 22, 2009 now U.S. Pat. No. 8,221,888.

FIELD OF INVENTION

The present invention relates to a color filter by copper and silver film and method for making same.

DESCRIPTION OF RELATED ART

A color filter is an essential device for color image processing; for example, it is required in an image sensor. Conventionally a photoresist-like coating material is used to form the color filter. US publication No. 2006/0180886 discloses a Fabry-Perot resonance color filter formed by silver film. The so-called Fabry-Perot resonance is shown in FIG. 1, wherein an incident light is reflected between two highly reflective layers, and only the light component with a particular resonance frequency can pass through; thus, it provides a color-filtering effect. However, silver deposition is not a mature technique which is yet to be integrated in the present semiconductor wafer manufacturing process. The color filter structure made of silver film as disclosed in the US publication No. 2006/0180886 is difficult to be realized.

The present invention provides a novel color filter structure and a method for making the color filter, whereby a Fabry-Perot resonance filter can be manufactured by a wafer manufacturing process that is presently achievable.

SUMMARY OF THE INVENTION

An objective of the present invention is to provide a color filter by copper and silver film.

The second objective of the present invention is to provide a method for making the color filter by copper and silver film.

In order to achieve the foregoing objective, in one perspective, the present invention provides a color filter by copper and silver film, comprising: a lower copper layer; a lower silver layer formed on the lower copper layer; a medium formed on the lower silver layer; an upper copper layer formed on the medium; and an upper silver layer formed on the upper copper layer.

In another perspective, the present invention provides a method for making a color filter by copper and silver film comprising: providing a lower copper layer as a seed layer; forming a lower silver layer on the lower copper layer by electroplating; forming a medium on the lower silver layer; forming an upper copper layer on the medium as a seed layer; and forming an upper silver layer on the upper copper layer by electroplating. The copper layer as the seed layer for example can be formed by PVD (Physical Vapor Deposition).

In the foregoing color filter by copper and silver film and method for making same, the medium preferably includes a material selected from silicon nitride, silicon oxynitride, and silicon carbide.

In the foregoing color filter by copper and silver film and method for making same, the copper layer preferably has a thickness larger than 0 nm and smaller than or equal to 20 nm.

In the foregoing color filter by copper and silver film and method for making same, the lower silver layer preferably has a thickness smaller than 30 nm.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustration only, to show the interrelationships between the process steps and between the layers, but not drawn according to actual scale.

Figure 1:
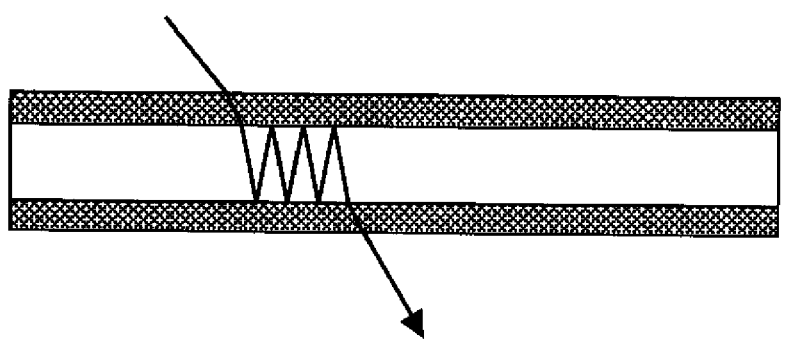
FIG. 1 shows a prior art structure in cross section.
Figure 2:
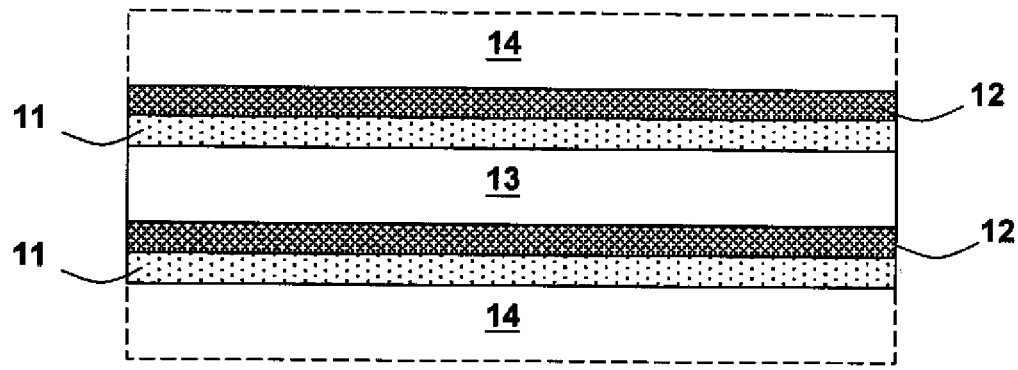
FIG. 2 shows an embodiment of the present invention.
Figure 3:
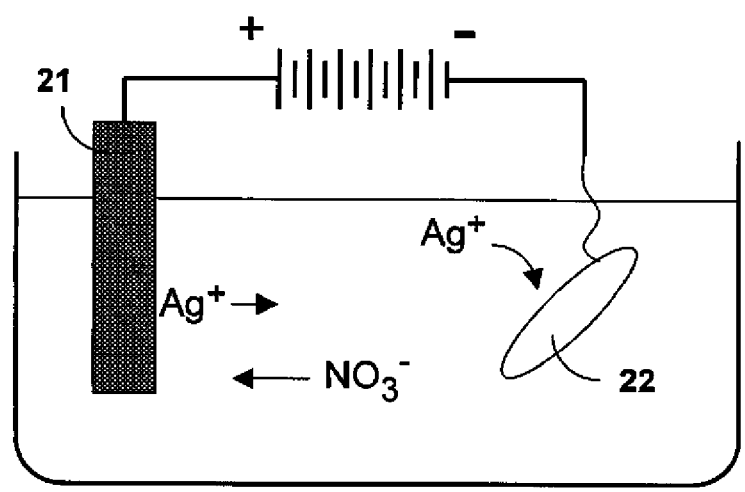
FIG. 3 shows a silver deposition method.

FIG. 2 illustrates the first embodiment of the present invention. The present invention has a distinguishing feature in that it provides a copper layer 11 first, and then forms a silver layer 12 on the copper layer 11. The copper layer 11 can be a very thin seed layer, not even have to be very dense. The seed layer for example can be formed by physical vapor deposition (PVD), which is a mature technique in the present semiconductor manufacturing process employing copper interconnection. After forming a copper seed layer, the silver layer 12 can be formed on the copper layer 11 by electroplating. The silver layer 12 may be formed in a manner as shown in FIG. 3: the electroplating may be performed in a proper electrolyte (e.g. aqueous nitric acid), with a silver rod 21 as the anode and the wafer 22 as the cathode.

A medium 13 is provided between the lower silver layer 12 and the upper copper layer 11, which should preferably be made of a material that is available in the present semiconductor manufacturing process and should preferably be able to provide a barrier function to copper. Such material for example may be silicon nitride, silicon oxynitride, or silicon carbide. The deposition processes of these materials have been mature today, such as chemical vapor deposition (CVD).

The Fabry-Perot color filter formed by "(the lower copper layer 11)+(lower silver layer 12)+(medium 13)+(upper copper layer 11)+(upper silver layer 12)" can be made as a stand-alone device or formed at any location or level in a semiconductor or micro-electro-mechanical system (MEMS) chip. When the Fabry-Perot color filter is formed in a chip, as shown in the figure, it can be formed between an upper and a lower structural layer 14. Such structural layer 14 for example may be silicon nitride, silicon oxynitride, or silicon carbide.

Figure 4:
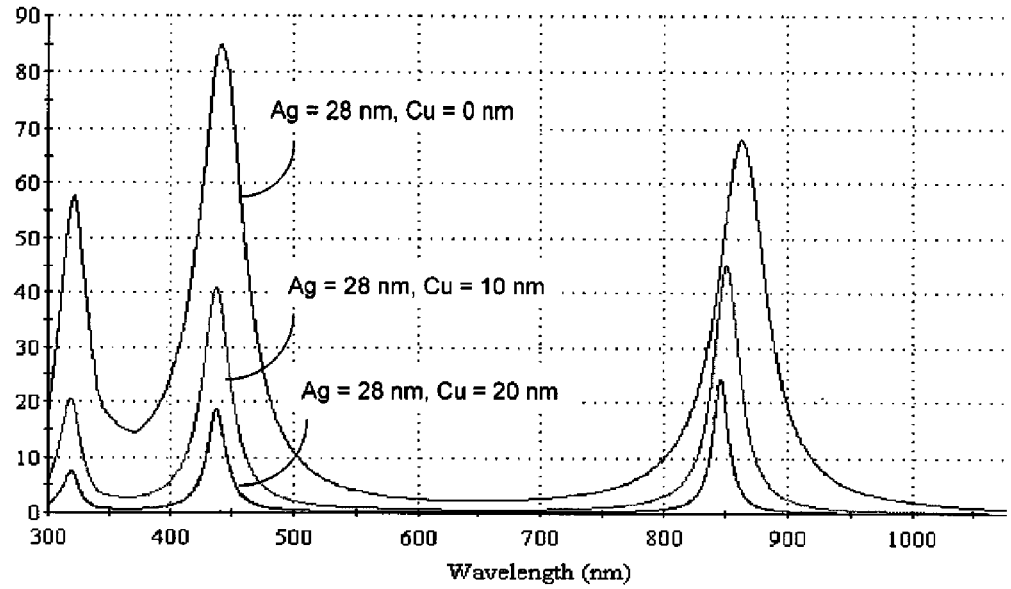
FIG. 4 and FIG. 5 show the transmittance of a composite copper and silver film.

FIG. 4 shows the effect of the thickness of the copper layer to light transmittance in a composite copper and silver film including a copper layer and a silver layer. The silver layer preferably has a thickness lower than 30 nanometers (nm). The figure shows the transmittance of the overall composite copper and silver film when the silver layer has a thickness fixed at 28 nm, and the copper layer has a thickness of 0 nm, 10 nm, and 20 nm respectively. As shown in the figure, the thinner the thickness of the copper layer is, the better the transmittance is. Yet, as mentioned earlier, a pure silver layer can not be integrated in the present wafer manufacturing process. Therefore, the thickness of the copper can not be zero, and thus it preferably has a thickness larger than 0 nm and smaller than or equal to 20 nm.

Figure 5:
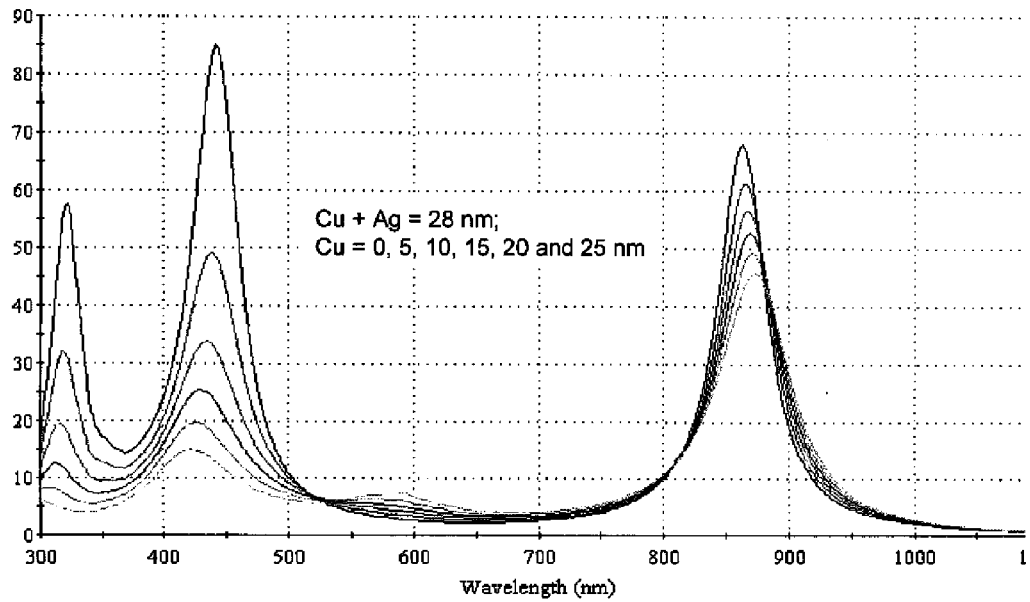

FIG. 5 shows the transmittance of the overall composite copper and silver film when the composite film has a total thickness fixed at 28 nm, and the copper layer has a thickness of 0 nm, 5 nm, 10 nm, 15 nm, and 20 nm respectively. Similarly, as shown in the drawing, the thinner the thickness of the copper layer is, the better the transmittance is.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, additional materials can be added between two layers shown in FIG. 2 without departing from the fundamental spirit of the present invention; the medium 13 can be a composite layer including two or more materials. In view of the foregoing, the spirit of the present invention should cover all such and other modifications and variations, which should be interpreted to fall within the scope of the following claims and their equivalents.

What is claimed is:

1. A method for making a color filter by copper and silver film comprising:

provi ding a lower copper layer as a seed layer onto a lower structural layer, the lower copper layer consisting substantially of copper and having a thickness larger than 0 nm and smaller than or equal to 20 nm;

forming a lower silver layer on the lower copper layer by electroplating;

forming a medium on the lower silver layer, wherein the medium includes a material selected from silicon nitride, silicon oxynitride, and silicon carbide;

forming an upper copper layer on the medium as a seed layer, the upper copper layer consisting substantially of copper and having a thickness larger than 0 nm and smaller than or equal to 20 nm; and forming an upper silver layer on the upper copper layer by electroplating forming an upper structural layer on the upper silver layer.

2. The method of claim 1, wherein the lower copper layer and the upper copper layer are formed by PVD (Physical Vapor Deposition).

3. The method of claim 1, wherein the lower silver layer has a thickness smaller than 30 nm, and the upper silver layer has a thickness smaller lower than 30 nm.

4. The method of claim 1, wherein the lower structural layer and the upper structural layer are selected from silicon nitride, silicon oxynitride, silicon carbide and a combination thereof.

* * * * *